(12) United States Patent
Zhao et al.

(10) Patent No.: US 12,514,111 B2
(45) Date of Patent: Dec. 30, 2025

(54) CONTROL LAYER AND METHOD FOR PREPARING SAME, AND PHOTOELECTRIC DEVICE

(71) Applicant: Shenzhen China Star Optoelectronics Semiconductor Display Technology Co., Ltd., Shenzhen (CN)

(72) Inventors: Jinyang Zhao, Shenzhen (CN); Lixuan Chen, Shenzhen (CN); Zhiqing Shi, Shenzhen (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 1048 days.

(21) Appl. No.: 17/620,350

(22) PCT Filed: Nov. 30, 2021

(86) PCT No.: PCT/CN2021/134419
§ 371 (c)(1),
(2) Date: Dec. 17, 2021

(87) PCT Pub. No.: WO2023/087392
PCT Pub. Date: May 25, 2023

(65) Prior Publication Data
US 2024/0431197 A1 Dec. 26, 2024

(30) Foreign Application Priority Data
Nov. 18, 2021 (CN) .......................... 202111374968.7

(51) Int. Cl.
*B82Y 20/00* (2011.01)
*B82Y 40/00* (2011.01)
(Continued)

(52) U.S. Cl.
CPC ............ *H10K 85/381* (2023.02); *C09K 11/02* (2013.01); *C09K 11/883* (2013.01); *C25D 13/02* (2013.01);
(Continued)

(58) Field of Classification Search
CPC .... H10K 85/381; C09K 11/883; C09K 11/02; C25D 13/02; C25D 13/04; C25D 13/12
See application file for complete search history.

(56) References Cited

U.S. PATENT DOCUMENTS

| 2009/0169866 A1 | 7/2009 | Ostafin et al. |
| 2011/0109854 A1 | 5/2011 | Tang et al. |

(Continued)

FOREIGN PATENT DOCUMENTS

| CN | 102422213 A | 4/2012 |
| CN | 102816563 A | 12/2012 |

(Continued)

OTHER PUBLICATIONS

International Search Report in International application No. PCT/CN2021/134419, mailed on Jul. 27, 2022.
(Continued)

*Primary Examiner* — Jayne L Mershon
(74) *Attorney, Agent, or Firm* — PV IP PC; Wei Te Chung

(57) ABSTRACT

A control layer and a method for preparing the same, and a photoelectric device are disclosed. A material of the control layer includes nano granules that are charged or electrically polarizable. In the present disclosure, the control layer is formed by the nano granules that are charged or electrically polarizable in a solvent, so that a refractive index of the control layer can be controlled by controlling a density of the nano granules, thereby improving the performance of the device.

19 Claims, 6 Drawing Sheets

(51) Int. Cl.
- *C09K 11/02* (2006.01)
- *C09K 11/88* (2006.01)
- *C25D 13/02* (2006.01)
- *C25D 13/04* (2006.01)
- *C25D 13/12* (2006.01)
- *H10K 85/30* (2023.01)

(52) U.S. Cl.
CPC ............ *C25D 13/04* (2013.01); *C25D 13/12* (2013.01); *B82Y 20/00* (2013.01); *B82Y 40/00* (2013.01)

(56) References Cited

U.S. PATENT DOCUMENTS

| | | | |
|---|---|---|---|
| 2012/0044128 A1* | 2/2012 | Joo | G02F 1/1685 345/76 |
| 2015/0268531 A1 | 9/2015 | Wang et al. | |
| 2020/0185592 A1 | 6/2020 | Spann et al. | |
| 2021/0163771 A1* | 6/2021 | Haben | C01B 25/08 |

FOREIGN PATENT DOCUMENTS

| | | |
|---|---|---|
| CN | 113061957 A | 7/2021 |
| CN | 113745442 A | 12/2021 |
| JP | 2015114640 A | 6/2015 |
| JP | 2020003643 A | 1/2020 |
| KR | 20110123229 A | 11/2011 |
| WO | 9119023 A2 | 12/1991 |
| WO | 2019130913 A1 | 7/2019 |
| WO | 2019187753 A1 | 10/2019 |
| WO | 2020136713 A1 | 7/2020 |

OTHER PUBLICATIONS

Written Opinion of the International Search Authority in International application No. PCT/CN2021/134419, mailed on Jul. 27, 2022.

Chinese Office Action issued in corresponding Chinese Patent Application No. 202111374968.7 dated Apr. 22, 2023, pp. 1-7.

\* cited by examiner

CONTROL LAYER AND METHOD FOR PREPARING SAME, AND PHOTOELECTRIC DEVICE

CROSS-REFERENCE TO RELATED APPLICATION

This application is a national phase application under 35 U.S.C. § 371 of PCT Application No. PCT/CN2021/134419, filed Nov. 30, 2021, which claims priority to Chinese Application No. 202111374968.7, filed Nov. 18, 2021, the contents of which are incorporated herein by reference in their entirety.

FIELD OF INVENTION

The present disclosure relates to the field of display technologies, and specifically, to a control layer and a method for preparing the same, and a photoelectric device.

BACKGROUND OF INVENTION

A nanomaterial is a material whose size of a structural unit is between 1 nanometer to 100 nanometers, and has a surface effect, a small size effect, and a macroscopic quantum tunneling effect. After people subdivide a macroscopic object into ultrafine particles (nano-level), the ultrafine particles show many strange properties. In other words, the optical, thermal, electrical, magnetic, mechanical, and chemical properties of the ultrafine particles are significantly different from those of bulk solids. Therefore, nanomaterials are widely used in many fields.

At present, a film layer formed by a nanomaterial is usually formed through spin coating. The refractive index of the film layer formed through spin coating is fixed and nonadjustable. Consequently, the film layer cannot well meet the requirement on the refractive index of the device, which affects the performance of the device.

SUMMARY OF THE INVENTION

Technical Problem

Embodiments of the present disclosure provide a control layer and a method for preparing the same, and a photoelectric device, to resolve the problem that the refractive index of the film layer is nonadjustable.

Technical Solution

The present disclosure provides a control layer, wherein a material of the control layer includes nano granules that are charged or electrically polarizable in a solvent.

Optionally, in some embodiments of the present disclosure, the nano granules include nanoparticles and ligands coated on surfaces of the nanoparticles, and the ligands are compounds that are charged or electrically polarizable in a solvent.

Optionally, in some embodiments of the present disclosure, the ligands include compounds having one or more of a carboxyl group, an amido group, a thiol group, a halogen, and a phosphino group, and one or a combination of surfactants.

Optionally, in some embodiments of the present disclosure, the ligands include one or more of polyethylene glycol, polyethylene glycol derivatives, polysiloxane, polysiloxane derivatives, polyvinyl carbazole, polyvinyl carbazole derivatives, polyvinyl alcohol, polyvinyl alcohol derivatives, octyl mercaptan, dodecyl mercaptan, phenyl mercaptan, 1, 2-phenyl mercaptan, 1, 3-phenyl mercaptan, 1, 4-phenyl mercaptan, 1, 2-ethylene mercaptan, 3-mercaptopropionic acid, oleic acid, 1, 2-ethylenediamine, octylamine, oleylamine, tri-n-octylphosphine, tributyl phosphine, ammonium thiocyanate, tetrabutylammonium iodide, tetrabutylammonium bromide, tetrabutylammonium chloride, tetrabutylammonium fluoride, calcium dodecylbenzene sulfonate, sodium dodecylbenzene sulfonate, barium dinonylnaphthalene sulfonate, cetyltrimethylammonium bromide (CTAB), N-vinylpyrrolidone polymer, cobalt naphtenate, aluminum naphthenate, iron naphthenate, cobalt stearate, aluminum stearate, or iron stearate.

Optionally, in some embodiments of the present disclosure, the nanoparticles include one or more of $BaSO_4$, $CaCO_3$, ZnSe, CdS, $TiO_2$, $BaTiO_3$, ZnS, $ZrO_2$, $Si_3N_4$, SnO, ZnO, CdSe, CdTe, ZnSe, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, $CuInS_2$, $CuInSe_2$, $AgInS_2$, $A_2B_{m-1}C_mX_{3m+1}$, and $BCX_3$, wherein $m \geq 1$, m is a positive integer, A is selected from one or more of $R_1$—$NH_3^+$ and D-$R_2$—$NH_3^+$, $R_1$ is a $C_6$-$C_{20}$ aromatic group or a $C_1$-$C_{20}$ alkyl group, $R_2$ is a $C_6$-$C_{20}$ aromatic group, D includes one or more of F, Cl, Br, and I, B is selected from one or more of $R_3$—$NH_3^+$, NH=$R_4$—$NH_3^+$, $Cs^+$, and $Rb^+$, $R_3$ is a $C_1$-$C_{20}$ alkyl group, and $R_4$ is a $C_1$-$C_{20}$ hydrocarbon group, C is selected from one or two of $Pb^{2+}$ or $Sn^{2+}$, and X is a halogen element.

Optionally, in some embodiments of the present disclosure, the control layer is a light-emitting layer, and the nano granules are loosely packed or closely packed.

Optionally, in some embodiments of the present disclosure, a mass ratio of the nanoparticles to the ligands is (1-10): 1.

Correspondingly, the present disclosure further provides a photoelectric device, including:
a control layer, wherein a material of the control layer includes nano granules that are charged or electrically polarizable in a solvent.

Optionally, in some embodiments of the present disclosure, the nano granules include nanoparticles and ligands coated on surfaces of the nanoparticles, and the ligands are compounds that are charged or electrically polarizable in a solvent.

The ligands include compounds having one or more of a carboxyl group, an amido group, a thiol group, a mercaptan group, a halogen, or a phosphino group, and one or more of surfactants.

The ligands include one or more of polyethylene glycol, polyethylene glycol derivatives, polysiloxane, polysiloxane derivatives, polyvinyl carbazole, polyvinyl carbazole derivatives, polyvinyl alcohol, polyvinyl alcohol derivatives, octyl mercaptan, dodecyl mercaptan, phenyl mercaptan, 1, 2-phenyl mercaptan, 1, 3-phenyl mercaptan, 1, 4-phenyl mercaptan, 1, 2-ethylene mercaptan, 3-mercaptopropionic acid, oleic acid, 1, 2-ethylenediamine, octylamine, oleylamine, tri-n-octylphosphine, tributyl phosphine, ammonium thiocyanate, tetrabutylammonium iodide, tetrabutylammonium bromide, tetrabutylammonium chloride, tetrabutylammonium fluoride, calcium dodecylbenzene sulfonate, sodium dodecylbenzene sulfonate, barium dinonylnaphthalene sulfonate, cetyltrimethylammonium bromide (CTAB), N-vinylpyrrolidone polymer, cobalt naphtenate, aluminum naphthenate, iron naphthenate, cobalt stearate, aluminum stearate, and iron stearate.

The nanoparticles include one or a combination of $BaSO_4$, $CaCO_3$, ZnSe, CdS, $TiO_2$, $BaTiO_3$, ZnS, $ZrO_2$, $Si_3N_4$, SnO, ZnO, CdSe, CdTe, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, $CuInS_2$, $CuInSe_2$, $AgInS_2$, $A_2B_{m-1}C_mX_{3m+1}$, and $BCX_3$, wherein $m \geq 1$, m is a positive integer, A is selected from one or more of $R_1$—$NH^+$ and D-$R_2$—$NH^+$, $R_1$ is a $C_6$-$C_{20}$ aromatic group or a $C_1$-$C_{20}$ alkyl group, $R_2$ is a $C_6$-$C_{20}$ aromatic group, D includes one or more of F, Cl, Br, or I, B is selected from one or more of $R_3$—$NH^+$, $NH=R_4$—$NH_3^+$, $Cs^+$, or $Rb^+$, $R_3$ is a $C_1$-$C_{20}$ alkyl group, and $R_4$ is a $C_1$-$C_{20}$ hydrocarbon group, C is selected from one or two of $Pb^{2+}$ or $Sn^{2+}$, and X is a halogen element.

Optionally, in some embodiments of the present disclosure, the control layer is a light-emitting layer, and the nano granules are loosely packed or closely packed.

Optionally, in some embodiments of the present disclosure, a mass ratio of the nanoparticles to the ligands is (1-10): 1.

Correspondingly, the present disclosure further provides a method for preparing a control layer, including:

providing a first electrode and a second electrode disposed opposite to each other;

disposing a solution having nano granules that are charged or electrically polarizable on the first electrode and the second electrode; and applying a voltage to the first electrode and the second electrode to form an electric field, for the nano granules that are charged or electrically polarizable to form the control layer.

Optionally, in some embodiments of the present disclosure, the applying a voltage to the first electrode and the second electrode to form an electric field, for the nano granules that are charged or electrically polarizable to form the control layer includes:

applying a first voltage to the first electrode and the second electrode to form a first electric field, for the nano granules that are charged or electrically polarizable to form the control layer, wherein the nano granules that are charged or electrically polarizable are loosely packed, a refractive index of the control layer is 1.5 to 2.4, and the refractive index of the control layer changes from a direction of 2.4 to a direction of 1.5.

Optionally, in some embodiments of the present disclosure, the applying a voltage to the first electrode and the second electrode to form an electric field, for the nano granules that are charged or electrically polarizable to form the control layer includes:

applying a second voltage to the first electrode and the second electrode to form a second electric field, for the nano granules that are charged or electrically polarizable to form the control layer, wherein the nano granules that are charged or electrically polarizable are closely packed, a refractive index of the control layer is 1.5 to 2.4, and the refractive index of the control layer changes from a direction of 1.5 to a direction of 2.4.

Optionally, in some embodiments of the present disclosure, the nano granules include nanoparticles and ligands coated on surfaces of the nanoparticles, and the ligands are compounds that are charged or electrically polarizable in a solvent.

Optionally, in some embodiments of the present disclosure, the ligands include compounds having one or more of a carboxyl group, an amido group, a thiol group, a mercaptan group, a halogen, or a phosphino group, and one or more of surfactants.

Optionally, in some embodiments of the present disclosure, the ligands include one or more of polyethylene glycol, polyethylene glycol derivatives, polysiloxane, polysiloxane derivatives, polyvinyl carbazole, polyvinyl carbazole derivatives, polyvinyl alcohol, polyvinyl alcohol derivatives, octyl mercaptan, dodecyl mercaptan, phenyl mercaptan, 1, 2-phenyl mercaptan, 1, 3-phenyl mercaptan, 1, 4-phenyl mercaptan, 1, 2-ethylene mercaptan, 3-mercaptopropionic acid, oleic acid, 1, 2-ethylenediamine, octylamine, oleylamine, tri-n-octylphosphine, tributyl phosphine, ammonium thiocyanate, tetrabutylammonium iodide, tetrabutylammonium bromide, tetrabutylammonium chloride, tetrabutylammonium fluoride, calcium dodecylbenzene sulfonate, sodium dodecylbenzene sulfonate, barium dinonylnaphthalene sulfonate, cetyltrimethylammonium bromide (CTAB), N-vinylpyrrolidone polymer, cobalt naphtenate, aluminum naphthenate, iron naphthenate, cobalt stearate, aluminum stearate, or iron stearate.

Optionally, in some embodiments of the present disclosure, the nanoparticles include one or more of $BaSO_4$, $CaCO_3$, ZnSe, CdS, $TiO_2$, $BaTiO_3$, ZnS, $ZrO_2$, $Si_3N_4$, SnO, ZnO, CdSe, CdTe, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, $CuInS_2$, $CuInSe_2$, $AgInS_2$, $A_2B_{m-1}C_mX_{3m+1}$, and $BCX_3$, wherein $m \geq 1$, m is a positive integer, A is selected from one or more of $R_1$—$NH^+$ and D-$R_2$—$NH_3^+$, $R_1$ is a $C_6$-$C_{20}$ aromatic group or a $C_1$-$C_{20}$ alkyl group, $R_2$ is a $C_6$-$C_{20}$ aromatic group, D includes one or a combination of F, Cl, Br, and I, B is selected from one or more of $R_3$—$NH_3^+$, $NH=R_4$—$NH_3^+$, $Cs^+$, or $Rb^+$, $R_3$ is a $C_1$-$C_{20}$ alkyl group, and $R_4$ is a $C_1$-$C_{20}$ hydrocarbon group, C is selected from one or two of $Pb^{2+}$ and $Sn^{2+}$, and X is a halogen element.

Optionally, in some embodiments of the present disclosure, the control layer is a light-emitting layer, and the nano granules are loosely packed or closely packed.

Optionally, in some embodiments of the present disclosure, a mass ratio of the nanoparticles to the ligands is (1-10): 1.

Beneficial Effects

The present disclosure discloses a control layer and a method for preparing the same, and a photoelectric device, wherein a material of the control layer includes nano granules that are charged or electrically polarizable. In the present disclosure, the nano granules that are charged or electrically polarizable in a solvent are used in the control layer, so that the control layer can adjust a refractive index by controlling a packing degree of the nano granules.

BRIEF DESCRIPTION OF DRAWINGS

To describe the technical solutions in the embodiments of the present disclosure more clearly, the following briefly describes accompanying drawings required for describing the embodiments. Apparently, the accompanying drawings in the following description show merely some embodiments of the present disclosure, and a person skilled in the art may still derive other drawings from these accompanying drawings without creative efforts.

DETAILED DESCRIPTION OF PREFERRED EMBODIMENTS

Figure 1:
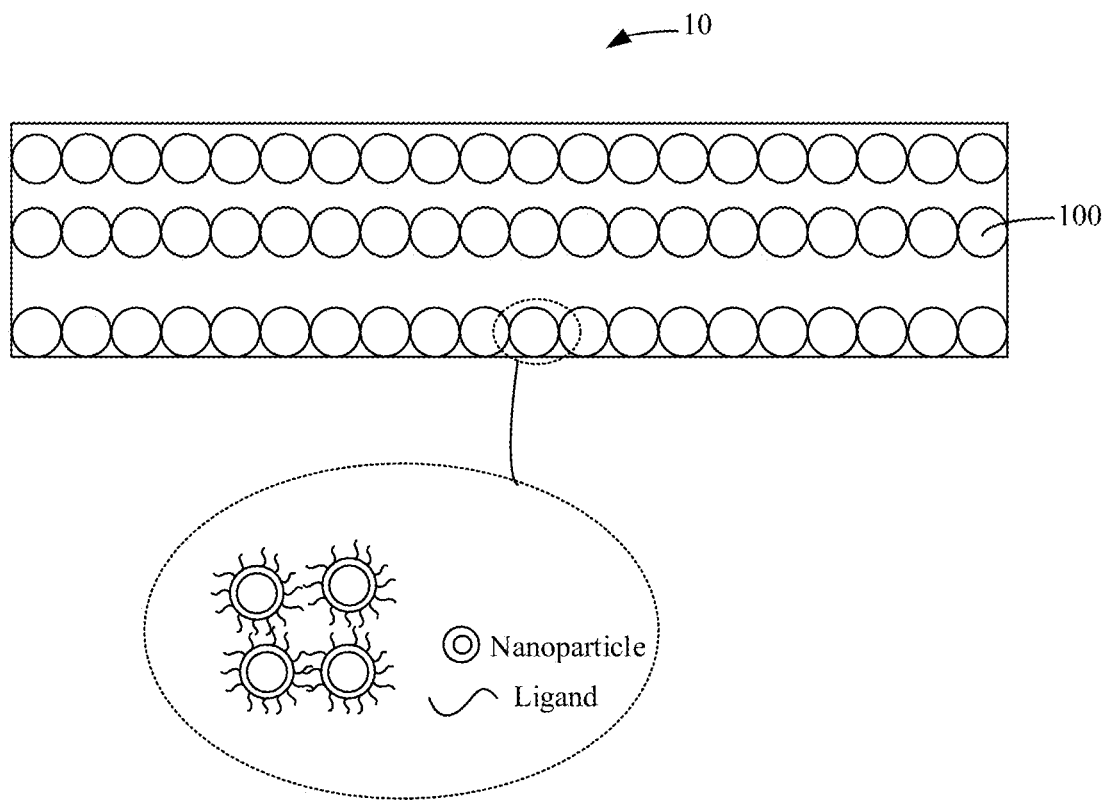
FIG. 1 is a schematic diagram of a first structure of a control layer according to an embodiment of the present disclosure.

The technical solutions in embodiments of the present disclosure are clearly and completely described in the following with reference to the accompanying drawings in the embodiments of the present disclosure. Apparently, the described embodiments are merely some rather than all of the embodiments of the present disclosure. All other embodiments obtained by a person skilled in the art based on the embodiments of the present disclosure without creative efforts shall fall within the protection scope of the present disclosure. In addition, it should be understood that the specific implementations described herein are merely used for describing and illustrating the present disclosure rather than limiting the present disclosure. In the present disclosure, without the contrary explanation, the directional terms, such as "upper" and lower" are usually refer to the upper and lower directions of an apparatus in actual use or working state, and specifically refer to the drawing directions in the accompanying drawings, and "inside and outside" are in terms of an outline of the apparatus. In the present disclosure, "reaction" may be a chemical reaction or a physical reaction.

The embodiments of the present disclosure provide a control layer and a method for preparing the same. A material of the control layer includes nano granules that are charged or electrically polarizable in a solvent.

The present disclosure discloses a control layer and a method for preparing the same, and a photoelectric device, wherein a material of the control layer includes nano granules that are charged or electrically polarizable. In the present disclosure, the nano granules that are charged or electrically polarizable in the solvent are used in the control layer, so that the control layer can adjust a refractive index of the control layer by controlling a packing degree of the nano granules, thereby improving the performance of the device.

Detailed descriptions are separately provided below.

Figure 2:
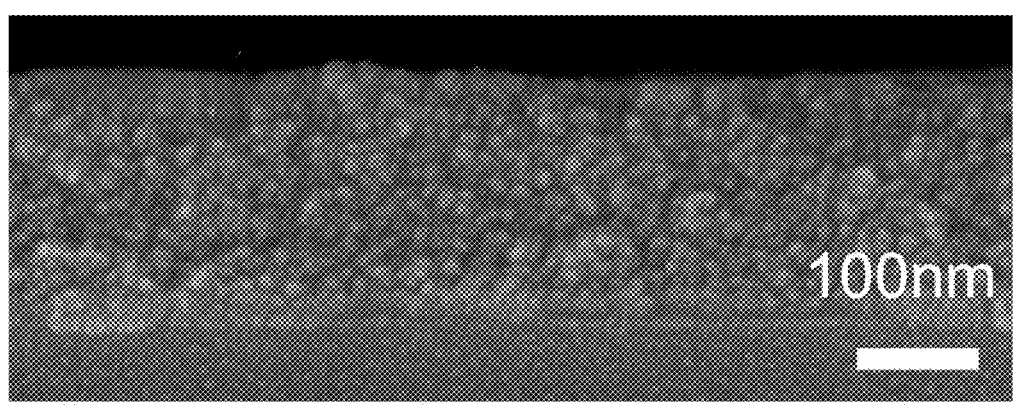
FIG. 2 is a schematic diagram of a scanning electron microscope of a control layer according to an embodiment of the present disclosure.

FIG. 1 is a schematic diagram of a first structure of a control layer according to an embodiment of the present disclosure. FIG. 2 is a schematic diagram of a scanning electron microscope of a control layer according to an embodiment of the present disclosure. The present disclosure provides a control layer 10. A material of the control layer 10 includes nano granules 100 that are charged or electrically polarizable in a solvent. The nano granules 100 include nanoparticles and ligands coated on surfaces of the nanoparticles. The ligands are compounds that are charged or electrically polarizable.

In the present disclosure, the ligands are added to the nanoparticles. Because the ligands are compounds that are charged or electrically polarizable in a solvent, the nano granules 100 can be ionized in a polar solvent, so that the control layer 10 is formed through electrodeposition, and by adjusting a magnitude of an electric field, a packing degree of the nano granules 100 is adjusted. That is, a packing density of the nano granules 100 is controlled, so that a refractive index n of the control layer 10 may vary between 1.5 and 2.4, that is, the refractive index of the control layer 10 is controlled.

In an embodiment, the nano granules 100 of the control layer 10 are loosely packed. When the nano granules 100 are loosely packed, the refractive index of the control layer 10 changes from a direction of 2.4 to a direction of 1.5, so that the refractive index decreases. In the present disclosure, the control layer 10 is formed by the nano granules 100 that are loosely packed. In this case, the refractive index of the control layer 10 depends on the nano granules 100 and air. A refractive index of the air is 1, refractive indexes of the nano granules 100 are greater than 1, and the nano granules 100 are loosely packed, leading to a large duty cycle of the air. Therefore, the refractive index of the control layer 10 is reduced, thereby improving the light extraction efficiency.

It should be noted that, the loose packing and the subsequent close packing are a relative concept, and there is no absolute loose packing or close packing. In an example, when a density of the nano granules 100 in the control layer 10 is less than 1.8 g/cm$^3$, the nano granules 100 in the control layer 10 are loosely packed, and when the density of the nano granules 100 in the control layer 10 is greater than 1.8 g/cm$^3$, the nano granules 100 in the control layer 10 are closely packed; or when a density of the nano granules 100 in the control layer 10 is less than 20 g/cm$^3$, the nano granules 100 in the control layer 10 are loosely packed, and when the density of the nano granules 100 in the control layer 10 is greater than 20 g/cm$^3$, the nano granules 100 in the control layer 10 are closely packed; or when a density of the nano granules 100 in the control layer 10 is less than 50 g/cm$^3$, the nano granules 100 in the control layer 10 are loosely packed, and when the density of the nano granules 100 in the control layer 10 is greater than 50 g/cm$^3$, the nano granules 100 in the control layer 10 are closely packed.

In an embodiment, the ligands include compounds having one or a combination of a carboxyl group, an amido group, a thiol group, a mercaptan group, a halogen, and a phosphino group, and one or a combination of surfactants.

In an embodiment, the surfactant includes organosilicate cetyltrimethylammonium bromide (CTAB), metal soap (naphthates or stearates of metals such as cobalt, aluminum, and iron), organic amine (N-vinylpyrrolidone polymer), or organophosphate.

In an embodiment, the ligands include one or a combination of polyethylene glycol, polyethylene glycol derivatives, polysiloxane, polysiloxane derivatives, polyvinyl carbazole, polyvinyl carbazole derivatives, polyvinyl alcohol, polyvinyl alcohol derivatives, octyl mercaptan, dodecyl mercaptan, phenyl mercaptan, 1, 2-phenyl mercaptan, 1, 3-phenyl mercaptan, 1, 4-phenyl mercaptan, 1, 2-ethylene mercaptan, 3-mercaptopropionic acid, oleic acid, 1, 2-ethylenediamine, octylamine, oleylamine, tri-n-octylphosphine, tributyl phosphine, ammonium thiocyanate, tetrabutylammonium iodide, tetrabutylammonium bromide, tetrabutylammonium chloride, tetrabutylammonium fluoride, calcium dodecylbenzene sulfonate, sodium dodecylbenzene sulfonate, barium dinonylnaphthalene sulfonate, cetyltrimethylammonium bromide (CTAB), N-vinylpyrrolidone polymer, cobalt naphtenate, aluminum naphthenate, iron naphthenate, cobalt stearate, aluminum stearate, and iron stearate.

In an embodiment, the nanoparticles include one or a combination of $BaSO_4$, $CaCO_3$, ZnSe, CdS, $TiO_2$, $BaTiO_3$, ZnS, $ZrO_2$, $Si_3N_4$, SnO, ZnO, CdSe, CdTe, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, $CuInS_2$, $CuInSe_2$, $AgInS_2$ and a perovskite quantum dot. Specifically, the perovskite quantum dot includes one or two combinations of $A_2B_{m-1}C_mX_{3m+1}$ and $BCX_3$, wherein m≥1, and m is a positive integer. A is selected from one or a combination of $R_1$—$NH_3^+$ and D-$R_2$—$NH_3^+$, $R_1$ is a $C_6$-$C_{20}$ aromatic group or a $C_1$-$C_{20}$ alkyl group, $R_2$ is a $C_6$-$C_{20}$ aromatic group, D includes one or a combination of F, Cl, Br, and I, B is selected from one or a combination of $R_3$—$NH_3^+$, NH=$R_4$—$NH_3^+$, $Cs^+$, and $Rb^+$, $R_3$ is a $C_1$-$C_{20}$ alkyl group, and $R_4$ is a $C_1$-$C_{20}$ hydrocarbon group, C is selected from one or two combinations of $Pb^{2+}$ and $Sn^{2+}$, and X is a halogen element. Further, a range of m meets 1≤m≤100, $R_1$—$NH_3^+$ is a phenethylamine ion or an n-butylamine ion, D-$R_2$—$NH_3^+$ is a halogenated phenethylamine ion, $R_3$—$NH_3^+$ is a methylamine ion, and NH=$R_4$—$NH_3^+$ is a formamidine ion.

In an embodiment, $A_2B_{m-1}C_mX_{3m+1}$ may be $(C_8H_{11}N)_2PbBr_4$. $BCX_3$ may be NH=$CH_2NH_3PbBr_3$, $CH_3NH_3PbCl_3$, $CsPbBr_3$, $CsSnBr_3$, $(C_8H_{11}N)_2SnBr_4$, $CH_3NH_3PbBr_3$ or $CH(NH_2)_2PbBr_3$.

In an embodiment, the control layer 10 is a light-emitting layer, the nanoparticles thereof are quantum dots, and the nano granules 100 are loosely packed. Specifically, the quantum dots include at least one of single structure quantum dots or core-shell structure quantum dots. The single structure quantum dots include at least one of CdSe, CdS, CdTe, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, $CuInS_2$, $CuInSe_2$, or $AgInS_2$. Cores of the core-shell structure quantum dots include at least one of the foregoing single-structure quantum dots, and shell materials of the core-shell structure quantum dots include at least one of CdS, CdTe, CdSeTe, CdZnSe, CdZnS, CdSeS, ZnSe, ZnSeS, or ZnS. In an example, the core-shell structure quantum dots include at least one of CdZnSe/CdZnS/ZnS, CdZnSe/ZnSe/ZnS, CdSe/ZnS, CdSe/ZnSe/ZnS, ZnSe/ZnS, ZnSeTe/ZnS, CdSe/CdZnSeS/ZnS, InP/ZnSe/ZnS, or InP/ZnSeS/ZnS.

In the present disclosure, the light-emitting layer is formed by the nano granules 100 that are loosely packed. In this case, the refractive index of the control layer 10 depends on the nano granules 100 and air. A refractive index of the air is 1, refractive indexes of the nano granules 100 are greater than 1, and the nano granules 100 are loosely packed, that is, a packing density of the nano granules 100 is large, leading to a large duty cycle of the air. Therefore, the refractive index of the control layer 10 is reduced, thereby improving the light extraction efficiency, and improving the luminous efficiency of the control layer 10.

Figure 3:
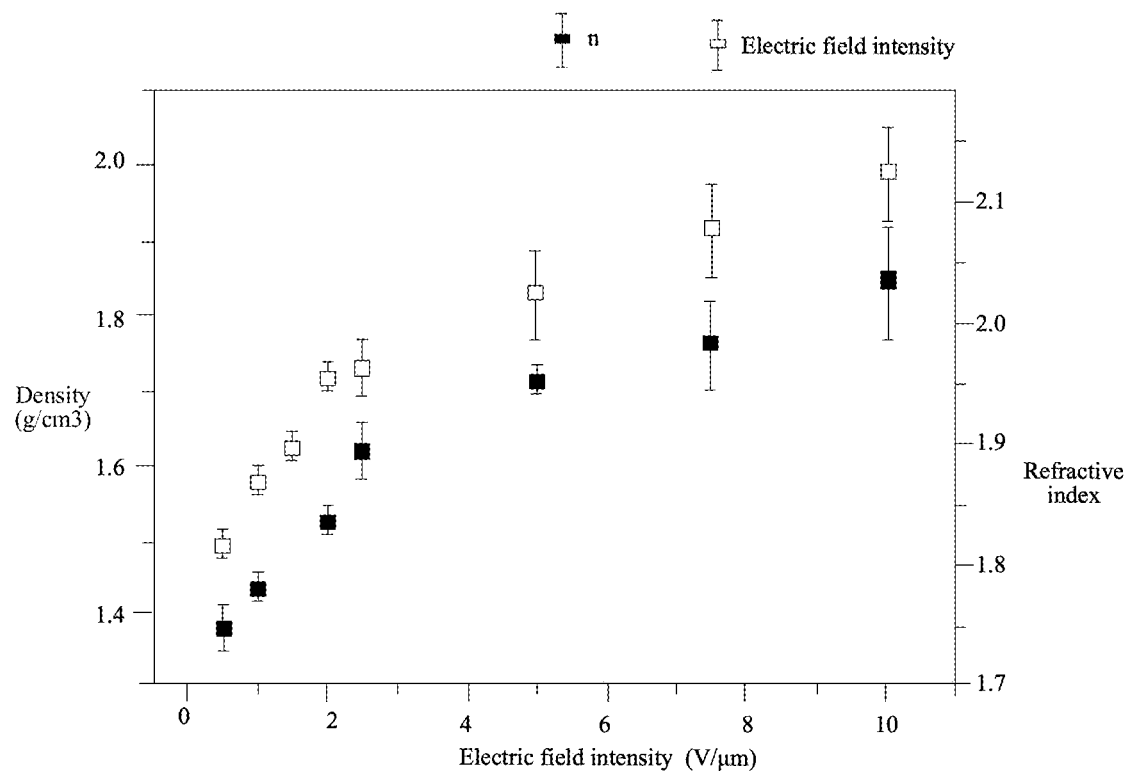
FIG. 3 is a schematic diagram of a density, a refractive index, and an electric field intensity of nano granules according to an embodiment of the present disclosure.

FIG. 3 is a schematic diagram of a density, a refractive index, and an electric field intensity of nano granules according to an embodiment of the present disclosure. An example in which nano granules 100 are formed by nanoparticles that are CdSe/ZnS and ligands that are polyethylene glycol is used for description. CdSe/ZnS and polyethylene glycol are mixed at a mass ratio of 5:1 to form the nano granules 100. When the control layer 10 is prepared, a small voltage is applied to the control layer 10 to form a small electric field, so that the nano granules 100 are loosely packed, that is, in this case, the control layer 10 is formed by nano granules that are packed in low density. The density of the nano granules 100 in the control layer 10 is 1.5 g/cm$^3$, and a refractive index of the control layer 10 is 1.74. That is, the density of the nano granules 100 is controlled by controlling a magnitude of the electric field, so as to control whether the nano granules 100 are loosely packed or closely packed, to control the refractive index of the control layer 10.

In an embodiment, a mass ratio of the nanoparticles to the ligands is (1-10): 1. Specifically, the mass ratio of the nanoparticles to the ligands may be 1:1, 2:1, 5:1, 7.5:1, 8:1, or 10:1. In the present disclosure, the mass ratio of the nanoparticles to the ligands is set to (1-10):1, so that the ligands may adhere to the nanoparticles, and the nano granules 100 may be charged or electrically polarizable under the action of the electric field, thereby improving the accuracy of controlling the nano granules 100 and further improving the performance of the control layer 10.

It should be noted that, the magnitude is a relative concept, and there is no absolute large or small magnitude. In an example, when the electric field intensity is less than 6 V/μm, the electric field is a small electric field, and when the electric field intensity is greater than 6 V/μm, the electric field is a large electric field; or when the electric field intensity is less than 50 V/μm, the electric field is a small electric field, and when the electric field intensity is greater than 50 V/μm, the electric field is a large electric field; or when the electric field intensity is less than 200 V/μm, the electric field is a small electric field, and when the electric field intensity is greater than 200 V/μm, the electric field is a large electric field. In an example, when the voltage is less than 6 V, the voltage is a small voltage, and when the voltage is greater than 6 V, the voltage is a large voltage; or when the voltage is less than 50 V, the voltage is a small voltage, and when the voltage is greater than 50 V, the voltage is a large voltage; or when the voltage is less than 200 V, the voltage is a small voltage, and when the voltage is greater than 200 V, the voltage is a large voltage.

It should be noted that, high and low are a relative concept, and there is no absolute high or low. In an example, when the density of the nano granules 100 in the control layer 10 is less than 1.8 g/cm$^3$, the nano granules 100 in the control layer 10 are in low density, and when the density of the nano granules 100 in the control layer 10 is greater than 1.8 g/cm$^3$, the nano granules 100 in the control layer 10 are in high density; or when the density of the nano granules 100 in the control layer 10 is less than 20 g/cm$^3$, the nano granules 100 in the control layer 10 are in low density, and when the density of the nano granules 100 in the control layer 10 is greater than 20 g/cm$^3$, the nano granules 100 in the control layer 10 are in high density; or when the density of the nano granules 100 in the control layer 10 is less than 50 g/cm³, the nano granules 100 in the control layer 10 are in low density, and when the density of the nano granules 100 in the control layer 10 is greater than 50 g/cm³, the nano granules 100 in the control layer 10 are in high density.

Figure 4:
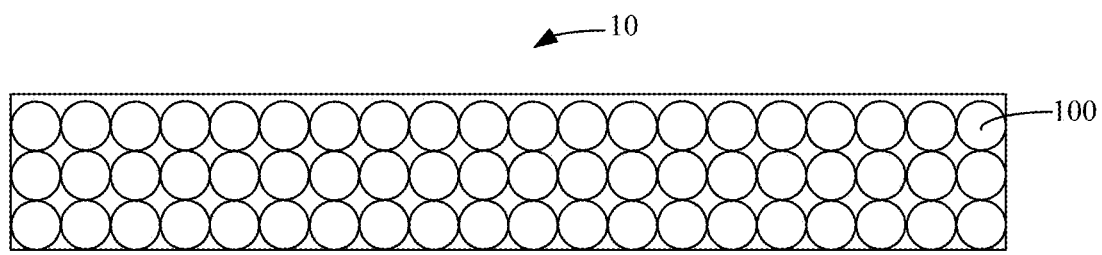
FIG. 4 is a schematic diagram of a second structure of a control layer according to an embodiment of the present disclosure.

FIG. 4 is a schematic diagram of a second structure of a control layer according to an embodiment of the present disclosure. A difference between the second structure and the first structure is as follows.

The nano granules 100 are closely packed. When the nano granules 100 are closely packed, the refractive index of the control layer 10 changes from a direction of 2.4 to a direction of 1.5, so that the refractive index of the control layer 10 increases. In the present disclosure, the control layer 10 is formed by nano granules 100 that are closely packed. In this case, the refractive index of the control layer 10 depends on the nano granules 100 and air. A refractive index of the air is 1, refractive indexes of the nano granules 100 are greater than 1, and the nano granules 100 are closely packed. In this case, spacings between the nano granules 100 are small, a duty cycle of the air is small, a duty cycle of a nanoparticle with high refractive index is large, and the refractive index of the control layer 10 is close to a refractive index thereof, so that the refractive index of the control layer 10 is improved, which is beneficial to a capability of light internal reflection of the control layer 10, thereby improving a carrier mobility and a light confinement capability, and improving optical quality of the device.

Still referring to FIG. 3, an example in which nano granules 100 are formed by nanoparticles that are CdSe/ZnS and ligands that are polyethylene glycol is used for description. CdSe/ZnS and polyethylene glycol are mixed at a mass ratio of 5:1 to form the nano granules 100. When the control layer 10 is prepared, a large voltage is applied to the control layer 10 to form a large electric field, so that the nano granules 100 are closely packed, the density of the nano granules 100 is 1.98 g/cm³, and the refractive index of the control layer 10 is 2.03.

In the present disclosure, the nano granules 100 are formed by the nanoparticles that are CdSe/ZnS and the ligands that are polyethylene glycol. When the control layer 10 is prepared, a voltage of 0-10.5 V/μm is applied to the control layer 10 to form an electric field. When the electric field changes, the density of the nano granules 100 changes between 1.5 and 1.98 g/cm³ as the electric field changes, so that the nano granules 100 are closely packed or loosely packed. When the density of the nano granules 100 changes, the refractive indexes of the nano granules 100 also vary between 1.74 and 2.03 as the density changes, that is, the density of the nano granules 100 is controlled by controlling a magnitude of the electric field, that is, the nano granules 100 are controlled to be loosely packed or closely packed, so as to adjust the refractive index of the control layer 10. The present disclosure provides a control layer 10. The ligands are added to the nanoparticles. Because the ligands are compounds that are charged or electrically polarizable in a solvent, the nano granules 100 can be ionized in a polar solvent, so that the control layer 10 is formed through electrodeposition, and by adjusting a magnitude of an electric field, a packing degree of the nano granules 100 is adjusted. That is, by adjusting the magnitude of the electric field, a packing density of the nano granules 100 is adjusted, so that a refractive index n of the control layer 10 may vary between 1.5 and 2.4, that is, the refractive index of the control layer 10 is controlled.

The present disclosure further provides a photoelectric device, including the control layer 10 provided in the present disclosure. The photoelectric device may be a light emitting diode, a photodetector, a photovoltaic, a sensor, or the like.

The present disclosure further provides a method for preparing a control layer, which includes steps of:

B11. Provide a first electrode and a second electrode disposed opposite to each other.

B12. Dispose a solution having nano granules that are charged or electrically polarizable on the first electrode and the second electrode.

B13. Apply a voltage to the first electrode and the second electrode to form an electric field, for the nano granules that are charged or electrically polarizable to form the control layer.

In the present disclosure, the electric field is formed between the first electrode and the second electrode by applying the voltage to the first electrode and the second electrode. Through the electric field, nano granules that are charged or electrically polarizable are charged or electrically polarizable in a solvent, to form a solution having the nano granules that are charged or electrically polarizable. In this way, a packing degree of the nano granules may be controlled through an electric field intensity, that is, a density of the nano granules is controlled by controlling the electric field intensity, so that a refractive index of the control layer is adjusted, thereby improving the performance of the control layer, and improving the performance of the device.

Detailed descriptions are as follows.

Embodiment 1

Figure 5:
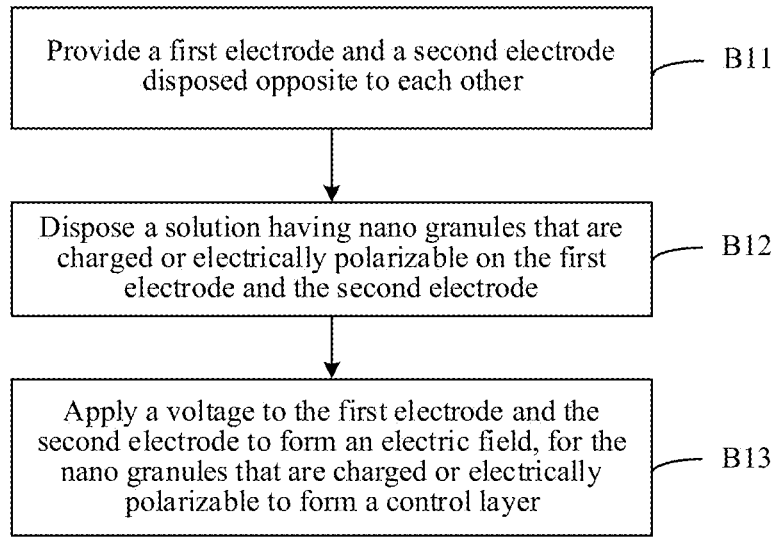
FIG. 5 is a schematic flowchart of a method for preparing a control layer according to an embodiment of the present disclosure.
Figure 6:
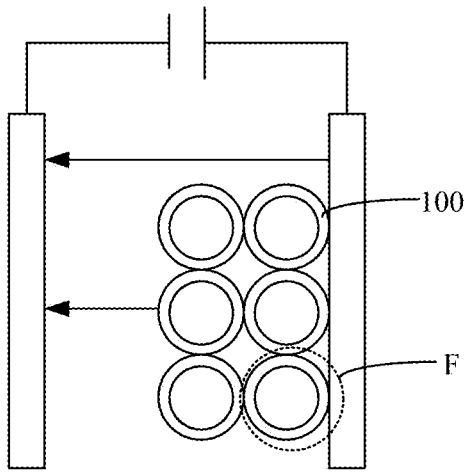
FIG. 6 is a schematic flowchart of a first structure of a method for preparing a control layer according to an embodiment of the present disclosure.

FIG. 5 is a schematic flowchart of a method for preparing a control layer according to an embodiment of the present disclosure. FIG. 6 is a schematic flowchart of a first structure of a method for preparing a control layer according to an embodiment of the present disclosure. The present disclosure further provides a method for preparing a control layer 10, which includes steps of:

B11. Provide a first electrode and a second electrode disposed opposite to each other.

Materials of the first electrode and the second electrode are independently selected from one or a combination of an indium tin oxide (ITO), a graphene, a metal, or a transition metal chalcogenide. The transition metal chalcogenide includes one or a combination of $MoS_2$, $MoSe_2$, $WS_2$, and $WSe_2$. The first electrode and second electrode may be external electrodes or electrodes on a setting device.

B12. Dispose a solution having nano granules that are charged or electrically polarizable on the first electrode and the second electrode.

Figure 7:
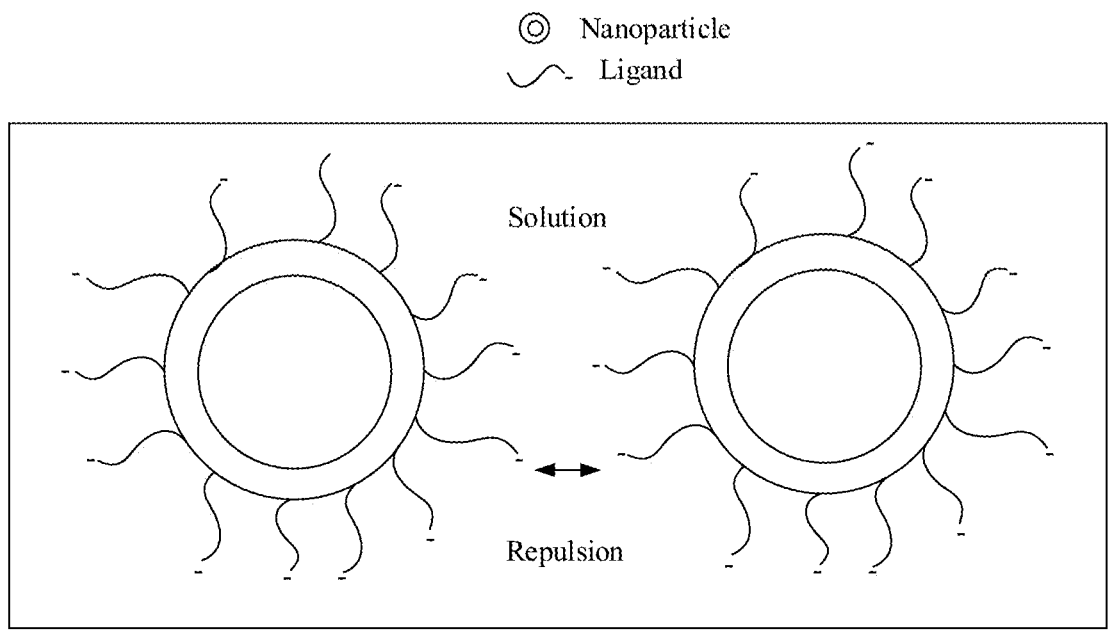
FIG. 7 is a schematic diagram of a structure of a method for preparing a control layer according to an embodiment of the present disclosure.
Figure 8:
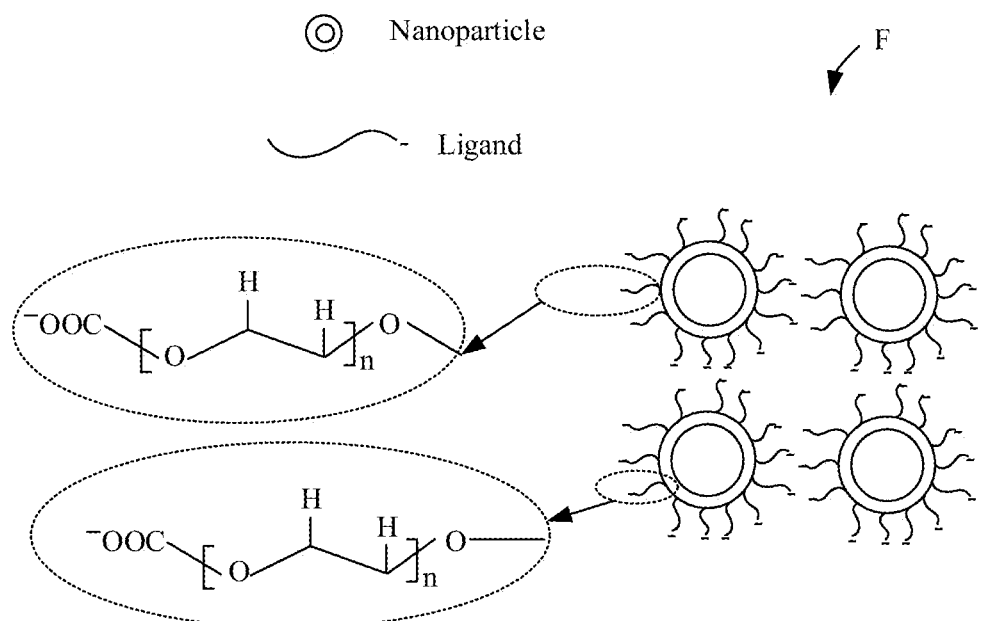
FIG. 8 is a schematic diagram of a structure of a nano granule according to an embodiment of the present disclosure.
Figure 9:
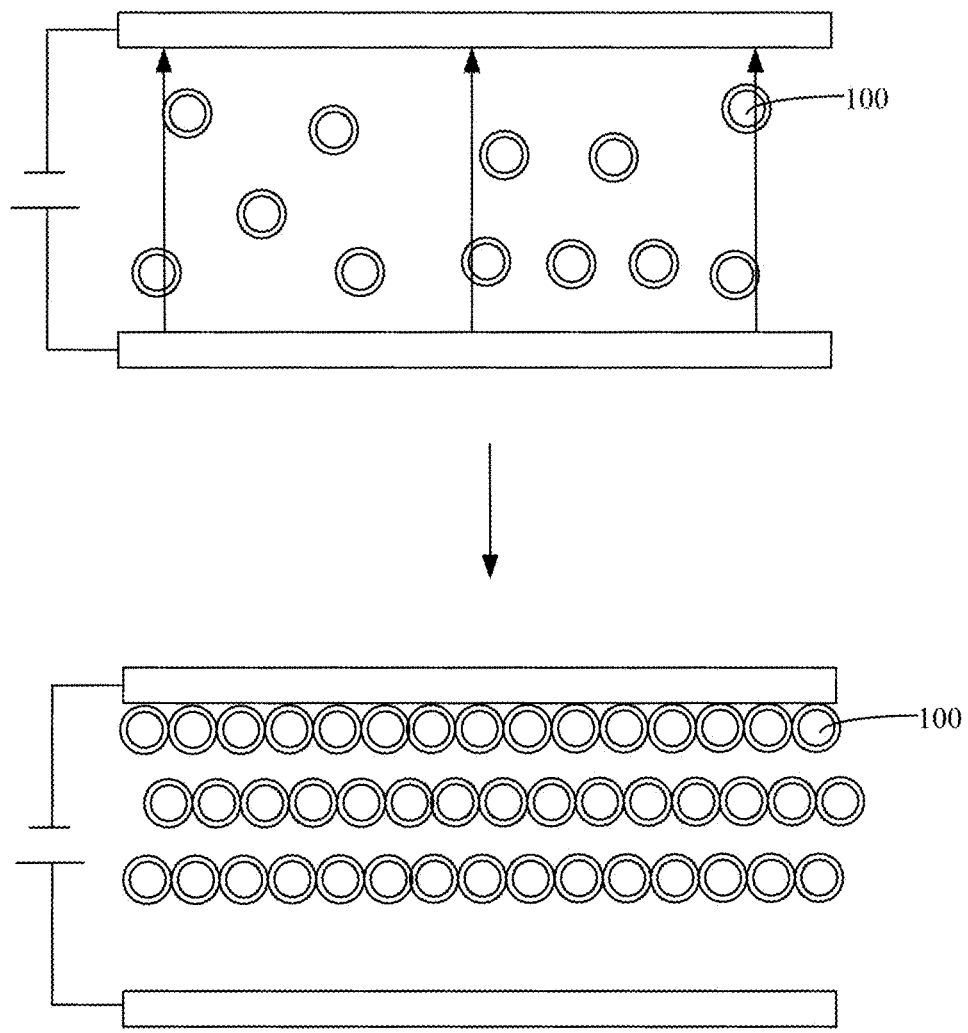
FIG. 9 is an enlarged schematic diagram of F in FIG. 6 according to an embodiment of the present disclosure.

FIG. 7 is a schematic diagram of a structure of a method for preparing a control layer according to an embodiment of the present disclosure. FIG. 8 is a schematic diagram of a structure of a nano granule according to an embodiment of the present disclosure. FIG. 9 is an enlarged schematic diagram of F in FIG. 6 according to an embodiment of the present disclosure. Specifically, nanoparticles and ligands with a mass ratio of (1-10):1 are dissolved in a solvent, to form a solution having nano granules 100 that are charged or electrically polarizable. In this case, the ligands are ionized in the solvent, and the nano granules 100 have positive charges or negative charges. An example in which the nano granules 100 have positive charges is used as an example for description. Then, the solution having nano granules 100 that are charged or electrically polarizable is dropped on the first electrode and the second electrode, or the first electrode and the second electrode are inserted into the solution having nano granules 100 that are charged or electrically polarizable.

The solvent is a polar solvent. Specifically, the solvent includes a colorless, transparent and volatile organic solvent with low-boiling-point or a colorless, transparent and volatile inorganic solvent with low-boiling-point.

In an embodiment, the mass ratio of the nanoparticles to the ligands may be 1:1, 2:1, 5:1, 7.5:1, 8:1, or 10:1. In the present disclosure, the mass ratio of the nanoparticles to the ligands is set to (1-10):1, so that the ligands may adhere to the nanoparticles, and the nano granules 100 may be charged or electrically polarizable under the action of the electric field, thereby improving the accuracy of controlling the nano granules 100 and further improving the performance of the control layer 10.

In an embodiment, the ligands include compounds having one or a combination of a carboxyl group, an amido group, a thiol group, a mercaptan group, a halogen, and a phosphino group, and one or a combination of surfactants.

In an embodiment, the surfactant includes organosilicate CTAB, metal soap (naphthates or stearates of metals such as cobalt, aluminum, and iron), organic amine (N-vinylpyrrolidone polymer), or organophosphate.

In an embodiment, the ligands include one or a combination of polyethylene glycol, polyethylene glycol derivatives, polysiloxane, polysiloxane derivatives, polyvinyl carbazole, polyvinyl carbazole derivatives, polyvinyl alcohol, polyvinyl alcohol derivatives, octyl mercaptan, dodecyl mercaptan, phenyl mercaptan, 1, 2-phenyl mercaptan, 1, 3-phenyl mercaptan, 1, 4-phenyl mercaptan, 1, 2-ethylene mercaptan, 3-mercaptopropionic acid, oleic acid, 1, 2-ethylenediamine, octylamine, oleylamine, tri-n-octylphosphine, tributyl phosphine, ammonium thiocyanate, tetrabutylammonium iodide, tetrabutylammonium bromide, tetrabutylammonium chloride, tetrabutylammonium fluoride, calcium dodecylbenzene sulfonate, sodium dodecylbenzene sulfonate, barium dinonylnaphthalene sulfonate, CTAB, N-vinylpyrrolidone polymer, cobalt naphtenate, aluminum naphthenate, iron naphthenate, cobalt stearate, aluminum stearate, and iron stearate.

In an embodiment, the nanoparticles include one or a combination of $BaSO_4$, $CaCO_3$, ZnSe, CdS, $TiO_2$, $BaTiO_3$, ZnS, $ZrO_2$, $Si_3N_4$, SnO, ZnO, CdSe, CdTe, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, $CuInS_2$, $CuInSe_2$, $AgInS_2$ and a perovskite quantum dot. Specifically, the perovskite quantum dot includes one or two combinations of $A_2B_{m-1}C_mX_{3m+1}$ and $BCX_3$, wherein m≥1, and m is a positive integer. A is selected from one or a combination of $R_1$—$NH_3^+$ and D-$R_2$—$NH_3^+$, $R_1$ is a $C_6$-$C_{20}$ aromatic group or a $C_1$-$C_{20}$ alkyl group, $R_2$ is a $C_6$-$C_{20}$ aromatic group, D includes one or a combination of F, Cl, Br, and I, B is selected from one or a combination of $R_3$—$NH_3^+$, NH=$R_4$—$NH_3$+, $Cs^+$, and $Rb^+$, $R_3$ is a $C_1$-$C_{20}$ alkyl group, and $R_4$ is a $C_1$-$C_{20}$ hydrocarbon group, C is selected from one or two combinations of $Pb^{2+}$ and $Sn^{2+}$, and X is a halogen element. Further, a range of m meets 1≤m≤100, $R_1$—$NH_3^+$ is a phenethylamine ion or an n-butylamine ion, D-$R_2$—$NH_3^+$ is a halogenated phenethylamine ion, $R_3$—$NH_3^+$ is a methylamine ion, and NH=$R_4$—$NH_3^+$ is a formamidine ion.

In an embodiment, $A_2B_{m-1}C_mX_{3m+1}$ may be $(C_8H_{11}N)_2PbBr_4$. $BCX_3$ may be NH=$CH_2NH_3PbBr_3$, $CH_3NH_3PbCl_3$, $CsPbBr_3$, $CsSnBr_3$, $(C_8H_{11}N)_2SnBr_4$, $CH_3NH_3PbBr_3$ or $CH(NH_2)_2PbBr_3$.

In the present disclosure, an example in which nano granules 100 are formed by nanoparticles that are CdSe/ZnS and ligands that are polyethylene glycol is used for description.

B13. Apply a voltage to the first electrode and the second electrode to form an electric field, for the nano granules that are charged or electrically polarizable to form the control layer.

Still referring to FIG. 3, a first voltage is applied to the first electrode and the second electrode to form a first electric field. The first voltage is a small voltage, and the first electric field is a small electric field. The nano granules 100 with positive charges gather to form huge nano granules 100. Under the action of the small electric field, the huge nano granules 100 move and gather on the first electrode, to form the control layer 10 in which the huge nano granules 100 are loosely packed. That is, a refractive index of the control layer 10 is 1.5 to 2.4, and changes from a direction of 2.4 to a direction of 1.5, so that the refractive index decreases.

A principle of forming the control layer 10 in which the nano granules 100 are loosely packed is as follows.

The small voltage is applied to the first electrode and the second electrode to form the small electric field. Due to mutual attraction of hydrogen bonds, the nano granules 100 gather together to form the huge nano granules 100. Under the action of the small electric field, the huge nano granules 100 can move and gather on the first electrode, and because a force of the small electric field is smaller than an electrostatic repulsion between the huge nano granules 100, the control layer 10 in which the huge nano granules 100 are loosely packed is formed. That is, under the action of the small electric field, the nano granules 100 cause the refractive index of the control layer 10 to change from the direction of 2.4 to the direction of 1.5.

For example, under the action of the small electric field, the nano granules 100 formed by CdSe/ZnS and the ligands that are polyethylene glycol move and gather on the first electrode, to form the control layer 10 in which the nano granules 100 are loosely packed. In this case, the refractive index of the control layer 10 is 2.03.

Compared with spin coating, sizes of nano granules 100 prepared through electrodeposition are larger, and pores of a film formed by the nano granules are larger. Therefore, a refractive index of the film is smaller. That is, the refractive index of the control layer 10 formed through electrodeposition is smaller than a refractive index of the control layer 10 formed through spin coating.

It should be noted that, the magnitude is a relative concept, and there is no absolute large or small magnitude. In an example, when the electric field intensity is less than 6 V/μm, the electric field is a small electric field, and when the electric field intensity is greater than 6 V/μm, the electric field is a large electric field; or when the electric field intensity is less than 50 V/μm, the electric field is a small electric field, and when the electric field intensity is greater than 50 V/μm, the electric field is a large electric field; or when the electric field intensity is less than 200 V/μm, the electric field is a small electric field, and when the electric field intensity is greater than 200 V/μm, the electric field is a large electric field. In an example, when the voltage is less than 6 V, the voltage is a small voltage, and when the voltage is greater than 6 V, the voltage is a large voltage; or when the voltage is less than 50 V, the voltage is a small voltage, and when the voltage is greater than 50 V, the voltage is a large voltage; or when the voltage is less than 200 V, the voltage is a small voltage, and when the voltage is greater than 200 V, the voltage is a large voltage.

In the present disclosure, the small voltage is applied to the first electrode and the second electrode to form the small electric field. Compared with the electrostatic repulsion between the nano granules 100 of the same electric property, the force of the small electric field is smaller, so that spacings between the nano granules 100 are larger, and the control layer 10 in which the nano granules 100 are loosely packed is formed, so as to adjust the refractive index of the control layer 10.

Embodiment 2

Figure 10:
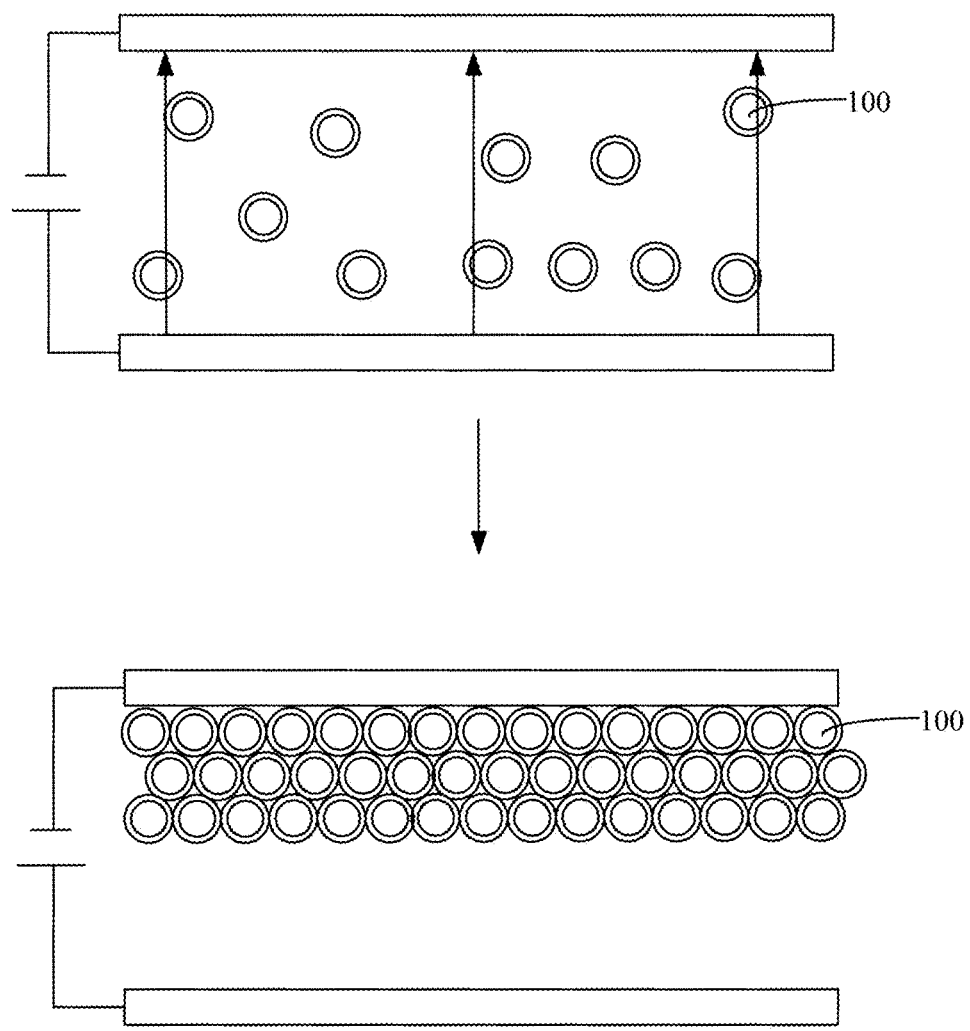
FIG. 10 is a schematic flowchart of a second structure of a method for preparing a control layer according to an embodiment of the present disclosure.

FIG. 10 is a schematic flowchart of a second structure of a method for preparing a control layer according to an embodiment of the present disclosure.

It should be noted that, differences between Embodiment 2 and Embodiment 1 are as follows.

Still referring to FIG. 3, the small voltage is changed to a large voltage, that is, the large voltage is a second voltage, and the small electric field is changed to a large electric field, that is, the large electric field is a second electric field. In the formed control layer 10, the nano granules 100 are closely packed. That is, under the action of the large electric field, the nano granules 100 cause the refractive index of the control layer 10 to change from a direction of 1.5 to a direction of 2.4.

Specifically, the large voltage is applied to the first electrode and the second electrode to form the large electric field. Under the action of the large electric field, the nano granules 100 formed by CdSe/ZnS and the ligands that are polyethylene glycol overcome the electrostatic repulsion between the nano granules 100. Because spacings between the nano granules 100 are small, the nano granules 100 move and gather on the first electrode, to form the control layer 10 in which the nano granules 100 are closely packed. In this case, the refractive index of the control layer 10 is 1.74. Other steps are the same as those in Embodiment 1, and details are not described herein again.

The present disclosure provides a method for preparing a control layer. A voltage is applied to a first electrode and a second electrode to form an electric field. A control layer 10 in which nano granules 100 are loosely packed or closely packed is formed by adjusting a magnitude of the electric field, that is, a density of the nano granules 100 is changed by adjusting the magnitude of the electric field, so that a refractive index of the control layer 10 varies between 1.5 and 2.4, thereby adjusting the refractive index of the control layer 10.

The present disclosure provides a control layer and a method for preparing the same, and a photoelectric device. The method for preparing the control layer 10 is as follows. A voltage is applied to a first electrode and a second electrode to form an electric field between the first electrode and the second electrode. Through the electric field, nano granules 100 that are charged or electrically polarizable are charged or electrically polarizable in a solvent, and a packing degree of the nano granules 100 may be controlled through an electric field intensity, that is, a density of the nano granules 100 is controlled by the electric field intensity, so that a refractive index of the control layer 10 changes between 1.5 and 2.4, and the refractive index of the control layer is adjusted, thereby improving the performance of the control layer, and improving the performance of the device.

A control layer and a method for preparing the same, and a photoelectric device provided in the embodiments of the present disclosure are described in detail above. The principles and implementations of the present disclosure are described through specific examples in this specification, and the descriptions of the embodiments are only intended to help understand the method and core ideas of the present disclosure. Meanwhile, a person skilled in the art may make modifications to the specific implementations and application scopes according to the ideas of the present disclosure. In conclusion, the content of the specification should not be construed as a limitation to the present disclosure.

What is claimed is:

1. A control layer, wherein a material of the control layer comprises nano granules that are charged or electrically polarizable in a solvent, and
the nano granules comprise nanoparticles and ligands coated on surfaces of the nanoparticles, the ligands are compounds that are charged or electrically polarizable in the solvent, and a mass ratio of the nanoparticles to the ligands is (1-10):1 to control a packing density of the nano granules under an action of an electric field.

2. The control layer as claimed in claim 1, wherein the ligands comprise compounds having one or more of a carboxyl group, an amido group, a thiol group, a mercaptan group, a halogen, or a phosphino group, and one or a combination of surfactants.

3. The control layer as claimed in claim 1, wherein the ligands comprise one or more of polyethylene glycol, polyethylene glycol derivatives, polysiloxane, polysiloxane derivatives, polyvinyl carbazole, polyvinyl carbazole derivatives, polyvinyl alcohol, polyvinyl alcohol derivatives, octyl mercaptan, dodecyl mercaptan, phenyl mercaptan, 1, 2-phenyl mercaptan, 1, 3-phenyl mercaptan, 1, 4-phenyl mercaptan, 1, 2-ethylene mercaptan, 3-mercaptopropionic acid, oleic acid, 1, 2-ethylenediamine, octylamine, oleylamine, tri-n-octylphosphine, tributyl phosphine, ammonium thiocyanate, tetrabutylammonium iodide, tetrabutylammonium bromide, tetrabutylammonium chloride, tetrabutylammonium fluoride, calcium dodecylbenzene sulfonate, sodium dodecylbenzene sulfonate, barium dinonylnaphthalene sulfonate, cetyltrimethylammonium bromide (CTAB), N-vinylpyrrolidone polymer, cobalt naphtenate, aluminum naphthenate, iron naphthenate, cobalt stearate, aluminum stearate, or iron stearate.

4. The control layer as claimed in claim 1, wherein the nanoparticles comprise one or more of $BaSO_4$, $CaCO_3$, ZnSe, CdS, $TiO_2$, $BaTiO_3$, ZnS, $ZrO_2$, $Si_3N_4$, SnO, ZnO, CdSe, CdTe, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, $CuInS_2$, $CuInSe_2$, $AgInS_2$, $A_2B_{m-1}C_mX_{3m+1}$, and $BCX_3$, wherein m≥1, m is a positive integer, A is selected from one or a combination of $R_1$—$NH_3^+$ and D-$R_2$—$NH_3^+$, $R_1$ is a $C_6$-$C_{20}$ aromatic group or a $C_1$-$C_{20}$ alkyl group, $R_2$ is a $C_6$-$C_{20}$ aromatic group, D comprises one or a combination of F, Cl, Br, or I, B is selected from one or a combination of $R_3$—$NH_3^+$, NH=$R_4$—$NH_3^+$, $Cs^+$, or $Rb^+$, $R_3$ is a $C_1$-$C_{20}$ alkyl group, and $R_4$ is a $C_1$-$C_{20}$ hydrocarbon group, C is selected from one or two of $Pb^{2+}$ or $Sn^{2+}$, and X is a halogen element.

5. The control layer as claimed in claim 1, wherein the control layer is a light-emitting layer, and has a refractive index of 1.5 to 2.4.

6. The control layer as claimed in claim 5, wherein when the electric field has a first voltage, the refractive index of the control layer changes from a direction of 2.4 to a direction of 1.5, and when the electric field has a second voltage, the refractive index of the control layer changes from a direction of 1.5 to a direction of 2.4, wherein the first voltage is less than the second voltage.

7. The control layer as claimed in claim 1, wherein when the electric field has a voltage of 0-10.5 V/μm, the packing density of the nano granules changes between 1.5 and 1.98 g/cm$^3$ to obtain a refractive index of the nano granules of 1.74 and 2.03.

8. A photoelectric device, comprising a control layer, wherein a material of the control layer comprises nano granules that are charged or electrically polarizable in a solvent, and
the nano granules comprise nanoparticles and ligands coated on surfaces of the nanoparticles, the ligands are compounds that are charged or electrically polarizable in the solvent, and a mass ratio of the nanoparticles to the ligands is (1-10):1 to control a packing density of the nano granules under an action of an electric field.

9. The photoelectric device as claimed in claim 8, wherein;
the ligands comprise compounds having one or more of a carboxyl group, an amido group, a thiol group, a mercaptan group, a halogen, or a phosphino group, and one or a combination of surfactants; and the ligands comprise one or more of polyethylene glycol, polyethylene glycol derivatives, polysiloxane, polysiloxane derivatives, polyvinyl carbazole, polyvinyl carbazole derivatives, polyvinyl alcohol, polyvinyl alcohol derivatives, octyl mercaptan, dodecyl mercaptan, phenyl mercaptan, 1, 2-phenyl mercaptan, 1, 3-phenyl mercaptan, 1, 4-phenyl mercaptan, 1, 2-ethylene mercaptan, 3-mercaptopropionic acid, oleic acid, 1, 2-ethylenediamine, octylamine, oleylamine, tri-n-octylphosphine, tributyl phosphine, ammonium thiocyanate, tetrabutylammonium iodide, tetrabutylammonium bromide, tetrabutylammonium chloride, tetrabutylammonium fluoride, calcium dodecylbenzene sulfonate, sodium dodecylbenzene sulfonate, barium dinonylnaphthalene sulfonate, cetyltrimethylammonium bromide (CTAB), N-vinylpyrrolidone polymer, cobalt naphtenate, aluminum naphthenate, iron naphthenate, cobalt stearate, aluminum stearate, or iron stearate; and the nanoparticles comprise one or more of BaSO$_4$, CaCO$_3$, ZnSe, CdS, TiO$_2$, BaTiO$_3$, ZnS, ZrO$_2$, Si$_3$N$_4$, SnO, ZnO, CdSe, CdTe, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, CuInS$_2$, CuInSe$_2$, AgInS$_2$, A$_2$B$_{m-1}$C$_m$X$_{3m+1}$, and BCX$_3$, wherein m≥1, m is a positive integer, A is selected from one or a combination of R$_1$—NH$_3^+$ or D-R$_2$—NH$_3^+$, R$_1$ is a C$_6$-C$_{20}$ aromatic group or a C$_1$-C$_{20}$ alkyl group, R$_2$ is a C$_6$-C$_{20}$ aromatic group, D comprises one or more of F, Cl, Br, and I, B is selected from one or more of R$_3$—NH$_3^+$, NH=R$_4$—NH$_3^+$, Cs$^+$, or Rb$^+$, R$_3$ is a C$_1$-C$_{20}$ alkyl group, and R$_4$ is a C$_1$-C$_{20}$ hydrocarbon group, C is selected from one or two of Pb$^{2+}$ and Sn$^{2+}$, and X is a halogen element.

10. The photoelectric device as claimed in claim 8, wherein the control layer is a light-emitting layer, and has a refractive index of 1.5 to 2.4.

11. The photoelectric device as claimed in claim 8, wherein when the electric field has a voltage of 0-10.5 V/μm, the packing density of the nano granules changes between 1.5 and 1.98 g/cm$^3$ to obtain a refractive index of the nano granules of 1.74 and 2.03.

12. The photoelectric device as claimed in claim 11, wherein when the electric field has a first voltage, the refractive index of the control layer changes from a direction of 2.4 to a direction of 1.5, and when the electric field has a second voltage, the refractive index of the control layer changes from a direction of 1.5 to a direction of 2.4, wherein the first voltage is less than the second voltage.

13. A method for preparing a control layer, comprising:
providing a first electrode and a second electrode disposed opposite to each other;
disposing a solution having nano granules that are charged or electrically polarizable on the first electrode and the second electrode; and
applying a voltage to the first electrode and the second electrode to form an electric field, for the nano granules that are charged or electrically polarizable to form the control layer,
wherein the nano granules comprise nanoparticles and ligands coated on surfaces of the nanoparticles, the ligands are compounds that are charged or electrically polarizable in a solvent, and a mass ratio of the nanoparticles to the ligands is (1-10):1 to control a packing density of the nano granules under an action of the electric field.

14. The method for preparing a control layer as claimed in claim 13, wherein the applying a voltage to the first electrode and the second electrode to form an electric field, for the nano granules that are charged or electrically polarizable to form the control layer comprises:
applying a first voltage to the first electrode and the second electrode to form a first electric field, for the nano granules that are charged or electrically polarizable to form the control layer, wherein a refractive index of the control layer is 1.5 to 2.4, and the refractive index of the control layer changes from a direction of 2.4 to a direction of 1.5.

15. The method for preparing a control layer as claimed in claim 13, wherein the applying a voltage to the first electrode and the second electrode to form an electric field, for the nano granules that are charged or electrically polarizable to form the control layer comprises: applying a second voltage to the first electrode and the second electrode to form a second electric field, for the nano granules that are charged or electrically polarizable to form the control layer, wherein a refractive index of the control layer is 1.5 to 2.4, and the refractive index of the control layer changes from a direction of 1.5 to a direction of 2.4.

16. The method for preparing a control layer as claimed in claim 13, wherein the ligands comprise compounds having one or more of a carboxyl group, an amido group, a thiol group, a mercaptan group, a halogen, or a phosphino group, and one or a combination of surfactants.

17. The method for preparing a control layer as claimed in claim 14, wherein the ligands comprise one or more of polyethylene glycol, polyethylene glycol derivatives, polysiloxane, polysiloxane derivatives, polyvinyl carbazole, polyvinyl carbazole derivatives, polyvinyl alcohol, polyvinyl alcohol derivatives, octyl mercaptan, dodecyl mercaptan, phenyl mercaptan, 1, 2-phenyl mercaptan, 1, 3-phenyl mercaptan, 1, 4-phenyl mercaptan, 1, 2-ethylene mercaptan, 3-mercaptopropionic acid, oleic acid, 1, 2-ethylenediamine, octylamine, oleylamine, tri-n-octylphosphine, tributyl phosphine, ammonium thiocyanate, tetrabutylammonium iodide, tetrabutylammonium bromide, tetrabutylammonium chloride, tetrabutylammonium fluoride, calcium dodecylbenzene sulfonate, sodium dodecylbenzene sulfonate, barium dinonylnaphthalene sulfonate, cetyltrimethylammonium bromide (CTAB), N-vinylpyrrolidone polymer, cobalt naphtenate, aluminum naphthenate, iron naphthenate, cobalt stearate, aluminum stearate, or iron stearate.

18. The method for preparing a control layer as claimed in claim 13, the nanoparticles comprise one or more of $BaSO_4$, $CaCO_3$, ZnSe, CdS, $TiO_2$, $BaTiO_3$, ZnS, $ZrO_2$, $Si_3N_4$, SnO, ZnO, CdSe, CdTe, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, InP, InAs, GaP, GaAs, GaSb, AlN, AlP, InAsP, InNP, InNSb, GaAlNP, InAlNP, $CuInS_2$, $CuInSe_2$, $AgInS_2$, $A_2B_{m-1}C_mX_{3m+1}$, and $BCX_3$, wherein $m \geq 1$, m is a positive integer, A is selected from one or more of $R_1$—$NH_3^+$ or D-$R_2$—$NH_3^+$, $R_1$ is a $C_6$-$C_{20}$ aromatic group or a $C_1$-$C_{20}$ alkyl group, $R_2$ is a $C_6$-$C_{20}$ aromatic group, D comprises one or more of F, Cl, Br, and I, B is selected from one or more of $R_3$—$NH_3^+$, NH=$R_4$—$NH_3^+$, $Cs^+$, or $Rb^+$, $R_3$ is a $C_1$-$C_{20}$ alkyl group, and $R_4$ is a $C_1$-$C_{20}$ hydrocarbon group, C is selected from one or two of $Pb^{2+}$ and $Sn^{2+}$, and X is a halogen element.

19. The method for preparing a control layer as claimed in claim 13, wherein the control layer is a light-emitting layer, and has a refractive index of 1.5 to 2.4.

* * * * *